US007955892B2

(12) United States Patent
Shah

(10) Patent No.: US 7,955,892 B2
(45) Date of Patent: Jun. 7, 2011

(54) MULTIPLE SIZE PACKAGE SOCKET

(75) Inventor: Sharad M. Shah, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 602 days.

(21) Appl. No.: 11/944,625

(22) Filed: Nov. 25, 2007

(65) Prior Publication Data

US 2009/0134511 A1    May 28, 2009

(51) Int. Cl.
  H01L 21/00    (2006.01)
  H01L 21/66    (2006.01)
  H01R 12/00    (2006.01)
  H01R 13/64    (2006.01)
  H01R 13/62    (2006.01)
  H05K 7/00     (2006.01)
  H05K 7/04     (2006.01)

(52) U.S. Cl. ............ 438/106; 438/15; 439/55; 439/366; 439/377; 361/679.02; 361/807

(58) Field of Classification Search .................. None
See application file for complete search history.

(56) References Cited

U.S. PATENT DOCUMENTS

| | | | | |
|---|---|---|---|---|
| 5,286,209 | A | * | 2/1994 | Nakagawa ................ 439/72 |
| 5,493,237 | A | * | 2/1996 | Volz et al. ................ 324/754 |
| 5,702,256 | A | | 12/1997 | Severn |
| 6,065,986 | A | * | 5/2000 | Mizuta ................ 439/266 |
| 6,407,566 | B1 | * | 6/2002 | Brunelle et al. ............ 324/758 |
| 6,485,321 | B1 | | 11/2002 | Trout et al. |
| 6,677,770 | B2 | * | 1/2004 | Frankowsky ............ 324/755 |
| 6,890,798 | B2 | * | 5/2005 | McMahon ................ 438/122 |
| 7,108,535 | B1 | * | 9/2006 | Mingviriya ................ 439/331 |
| 7,195,493 | B1 | * | 3/2007 | Polnyi ............ 439/70 |
| 7,604,486 | B2 | * | 10/2009 | Martinson et al. ............ 439/70 |
| 2001/0026152 | A1 | * | 10/2001 | Kang et al. ................ 324/158.1 |
| 2002/0117751 | A1 | * | 8/2002 | Crane et al. ................ 257/734 |
| 2003/0151420 | A1 | * | 8/2003 | Bai et al. ................ 324/755 |
| 2003/0222332 | A1 | * | 12/2003 | Tran ................ 257/678 |
| 2004/0017666 | A1 | | 1/2004 | Yang |
| 2005/0204551 | A1 | * | 9/2005 | Koizumi et al. ............ 29/739 |
| 2006/0068614 | A1 | * | 3/2006 | Harper ................ 439/70 |

FOREIGN PATENT DOCUMENTS

EP    0 220 600 A2    5/1987
WO    WO 02/23203 A1    3/2002

OTHER PUBLICATIONS

International Search Report and Writtent Opinion for corresponding application No. PCT/US2008/012981, dated Apr. 7, 2009, pp. 1-14.

* cited by examiner

*Primary Examiner* — Scott B Geyer
(74) *Attorney, Agent, or Firm* — Ditthavong Mori & Steiner, P.C.

(57) ABSTRACT

Various sockets for multiple sizes of chip package substrates are disclosed. In one aspect, an apparatus is provided that includes a socket that has a peripheral wall defining an interior space adapted to receive either of a first semiconductor chip package substrate and a second semiconductor chip package substrate. The first semiconductor chip package substrate has a first size and a first plurality of structural features and the second semiconductor chip package substrate has a second size different than the first size and a second plurality of structural features. The socket has a third plurality of structural features operable to engage the structural features of either of semiconductor chip package substrates to selectively enable the first semiconductor chip package substrate to be located at a first preselected position in the interior space and the second semiconductor chip package substrate to be located at a second preselected position in the interior space.

20 Claims, 5 Drawing Sheets

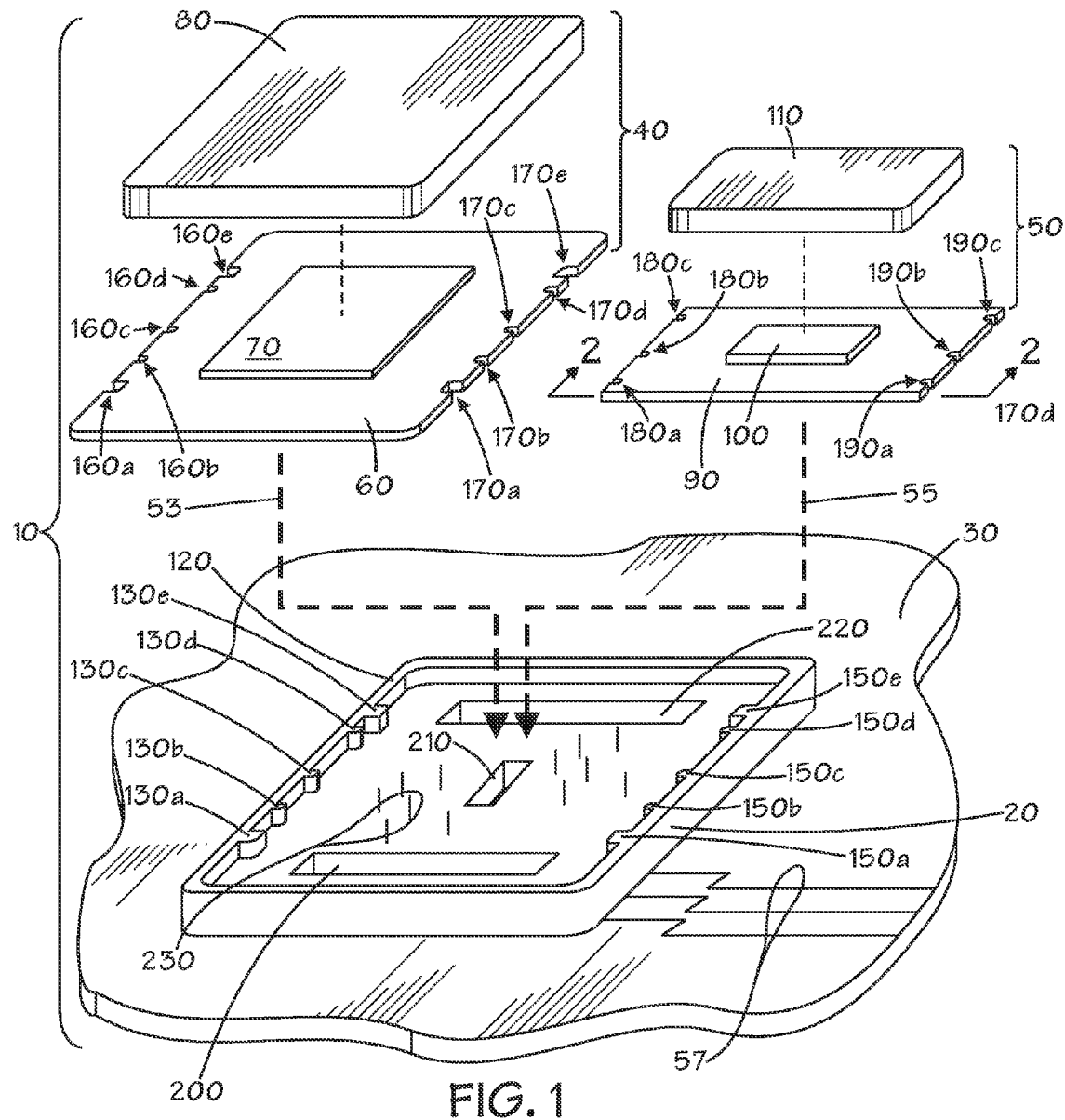
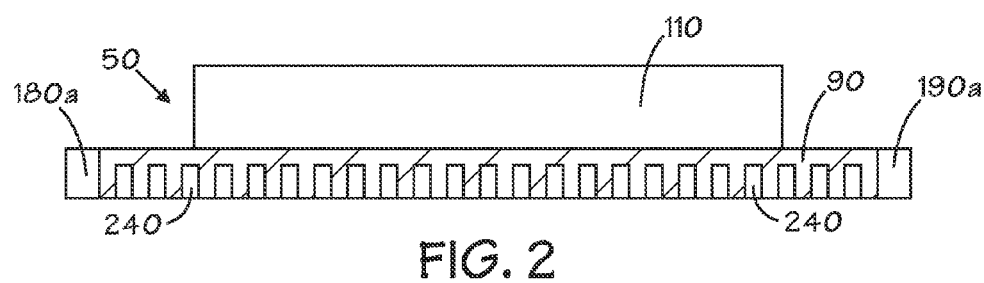

MULTIPLE SIZE PACKAGE SOCKET

BACKGROUND OF THE INVENTION

1. Field of the Invention

This invention relates generally to semiconductor processing, and more particularly to semiconductor chip sockets and methods of making the same.

2. Description of the Related Art

Many types of conventional semiconductor chips are formed as multiple dice on a semiconductor wafer. After the wafer is fully processed, a dicing operation is performed to separate one die from another. Some types of semiconductor die are subsequently mounted directly on a circuit board without the need for a package. However, other types, particularly processor chips, are destined for a package of one sort or another.

One conventional variant of a semiconductor chip package consists of a base substrate upon which a semiconductor chip or multiple chips are mounted. Some conventional designs also consist of a lid that is placed over the semiconductor chip and secured to the substrate by way of an adhesive. The package substrate of the conventional semiconductor chip package is designed to interface electrically with, for example, a socket that is connected to a printed circuit board of one type or another.

One conventional packaged chip board socket consists of a body that has a peripheral wall that defines an interior space in which a single size of a chip package substrate may be inserted. In other words, a particular socket design is tied to the geometry of a particular size of a chip package substrate. Semiconductor chips and their corresponding semiconductor chip package substrates come in a large variety of sizes. Accordingly, motherboard and other card manufacturers must make a correspondingly large variety of different sized sockets to accommodate the myriad of different chip package sizes. If a socket were capable of receiving multiple sized chip package substrates, then certain manufacturing efficiencies could be realized and the number of different types of sockets that card and board suppliers must design and make would be substantially reduced.

The present invention is directed to overcoming or reducing the effects of one or more of the foregoing disadvantages.

SUMMARY OF THE INVENTION

In accordance with one aspect of the present invention, a method of manufacturing is provided that includes forming a socket with a peripheral wall defining an interior space that is adapted to receive either of a first semiconductor chip package substrate and a second semiconductor chip package substrate. The first semiconductor chip package substrate has a first size and a first plurality of structural features and the second semiconductor chip package substrate has a second size different than the first size and a second plurality of structural features. A third plurality of structural features are formed for the socket. The third plurality of structural features is operable to engage either of the first plurality of structural features of the first semiconductor chip package substrate and the second plurality of features of the second semiconductor chip package substrate to selectively enable the first semiconductor chip package substrate to be located at a first preselected position in the interior space and the second semiconductor chip package substrate to be located at a second preselected position in the interior space.

In accordance with another aspect of the present invention, a method of manufacturing is provided that includes providing a socket with a peripheral wall defining an interior space that is adapted to receive either of a first semiconductor chip package substrate and a second semiconductor chip package substrate. The first semiconductor chip package substrate has a first size and a first plurality of structural features and the second semiconductor chip package substrate has a second size different than the first size and a second plurality of structural features. The socket has a third plurality of structural features for the socket operable to engage either of the first plurality of structural features of the first semiconductor chip package substrate and the second plurality of features of the second semiconductor chip package substrate to selectively enable the first semiconductor chip package substrate to be located at a first preselected position in the interior space and the second semiconductor chip package substrate to be located at a second preselected position in the interior space. The socket is coupled to a printed circuit board and one or the other of the first and second semiconductor chip package substrates is mounted in the socket.

In accordance with another aspect of the present invention, an apparatus is provided that includes a socket that has a peripheral wall defining an interior space adapted to receive either of a first semiconductor chip package substrate and a second semiconductor chip package substrate. The first semiconductor chip package substrate has a first size and a first plurality of structural features and the second semiconductor chip package substrate has a second size different than the first size and a second plurality of structural features. The socket has a third plurality of structural features operable to engage either of the first plurality of structural features of the first semiconductor chip package substrate and the second plurality of features of the second semiconductor chip package substrate to selectively enable the first semiconductor chip package substrate to be located at a first preselected position in the interior space and the second semiconductor chip package substrate to be located at a second preselected position in the interior space.

BRIEF DESCRIPTION OF THE DRAWINGS

The foregoing and other advantages of the invention will become apparent upon reading the following detailed description and upon reference to the drawings in which:

FIG. 1 is an exploded pictorial view of an exemplary embodiment of a computing device that includes a socket coupled to a printed circuit board;

FIG. 2 is a sectional view of FIG. 1 taken at section 2-2;

DETAILED DESCRIPTION OF SPECIFIC EMBODIMENTS

Figure 3:
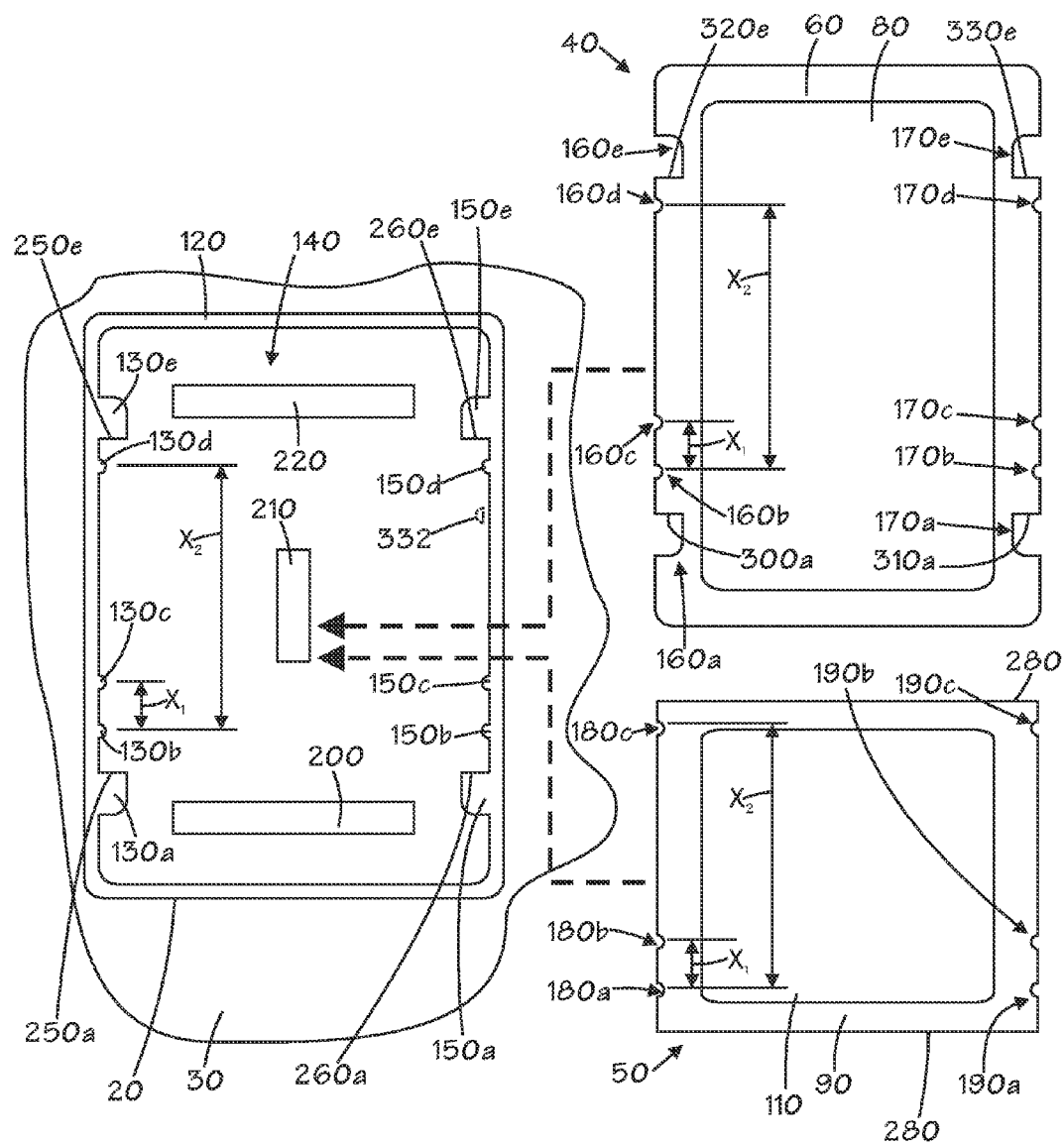
FIG. 3 is an overhead view of the socket and printed circuit board depicted in FIG. 1.

In the drawings described below, reference numerals are generally repeated where identical elements appear in more than one figure. Turning now to the drawings, and in particular to FIG. 1, therein is shown an exploded pictorial view of an exemplary embodiment of a computing device 10 that includes a socket 20 coupled to a printed circuit board 30. The socket 20 is configured to receive multiple sizes of semiconductor chip packages, two examples of which are shown exploded from the socket 20 and labeled 40 and 50 respectively. The socket 20 is configured so that one or the other of the packages 40 and 50 may be seated in the socket 20 as suggested by the dashed lines 53 and 55. The printed circuit board 30 may be any of a variety of printed circuit boards used in electronic systems, such as, for example, a motherboard, a daughterboard, a card or other type of substrate. The printed circuit board 30 may be constructed of ceramics, epoxies with fills, plastics or the like. Power and signals are routed around the printed circuit board 30 by multiple electrical conductors, such as the three exemplary traces collectively labeled 57. There may be many scores of such conductors on and/or in the printed circuit board 30. It should be understood that only a portion of the printed circuit board 30 is shown in FIG. 1.

The semiconductor chip package 40 includes a base substrate 60 and an integrated circuit 70 mounted to the base substrate 60. The package 40 may include an optional lid 80 that is shown exploded from the substrate 60. The semiconductor chip package 50 similarly includes a base substrate 90 upon which an integrated circuit 100 is coupled and may include an optional lid 110, which is shown exploded from the substrate 90. The substrates 60 and 90 may be ceramic or organic. If organic, the substrates 60 and 90 may be standard core, thin core or coreless as desired. The semiconductor chips 70 and 100 may be any of a myriad of different types of circuit devices used in electronics, such as, for example, microprocessors, graphics processors, application specific integrated circuits, memory devices or the like, and may be single or multi-core. Optionally, multiple chips may be coupled to each substrate 60 and 90. The semiconductor chips 70 and 100 may be fabricated using silicon, germanium or other semiconductor materials. If desired, the chips 70 and 100 may be fabricated as a semiconductor-on-insulator substrates. The optional lids 80 and 110 may be bathtub, top hat or other designs and fabricated from plastics, metals or ceramics. In an exemplary embodiment, the lids 80 and 110 may be composed of a copper core jacketed with nickel.

The socket 20 includes a peripheral wall 120 that has a plurality of structural features or members 130a, 130b, 130c, 130d and 130e that project inwardly toward an interior space 140 circumscribed by the wall 120. The wall 120 includes a corresponding and oppositely projecting plurality of structural features or members 150a, 150b, 150c, 150d and 150e that project into the interior space 140. The members 130a, 130b, 130c, 130d and 130e and the members 150a, 150b, 150c, 150d and 150e are designed to engage corresponding sets of structural features or notches 160a, 160b, 160c, 160d and 160e and 170a, 170b, 170c, 170d and 170e, respectively, on the package substrate 60 of the package 40. In addition, the members 130b, 130c and 130d and the members 150b, 150c and 150d are sized and spaced to engage two corresponding pluralities of structural features or notches 180a, 180b and 180c and 190a, 190b and 190c of the substrate 90 of the integrated circuit package 50. In this way, the socket 120 can accommodate either the package 40 or the package 50.

The socket 20 may be provided with one or more openings, three of which are shown and labeled 200, 210 and 220. The openings 200, 210 and 220 may be provided to accommodate circuit structures of the printed circuit board 30 (not shown) or for other electronic needs. The socket 20 may be configured to interconnect electrically with the package substrates 60 and 90 in a variety of ways. Land grid arrays, pin grid arrays, ball grid arrays or other types of interconnect schemes may be used. In the exemplary embodiment depicted in FIG. 1, the socket 20 may be configured as land grid array and thus include a plurality of upwardly projecting conductor pins, only a few of which are shown for simplicity of illustration and labeled collectively 230. The pins 230 may be fabricated from conductor materials such as gold, silver, copper, platinum, nickel, mixtures of these or the like. In an exemplary embodiment, the pins 230 may be composed of gold plated copper.

Additional detail regarding the package substrate 90 may be understood by referring now to FIG. 2, which is a sectional view of FIG. 1 taken at section 2-2. Note that because of the location of section 2-2, only the circuit package 50 is visible in FIG. 2, and only the substrate 90, and not the lid 110, will be shown in section. Furthermore, the notches 180a and 190a are visible. As noted above, this illustrative embodiment is configured as a land grid array such that the socket 20 depicted in FIG. 1 has a plurality of upwardly projecting conductor pins 230. To connect to the pins 230, the substrate 90 may be provided with a plurality of sockets, a couple of which are labeled 240. The number and arrangement of the sockets 240 will depend upon the requirements of the circuit package 50 as well as the number and arrangement of the conductor pins 230 of the socket 20.

Additional details of the socket 20 and the packages 40 and 50 may be understood by referring now also to FIG. 3, which is an overhead view of the socket 20, a portion of the printed circuit board 30 and the packages 40 and 50, which are positioned adjacent to but not in the socket 20. The openings 200, 210 and 220 are dispersed in the space 140 defined by the socket wall 120. The members 130a, 130b, 130c, 130d, 130e, 150a, 150b, 150c, 150d and 150e of the socket 20 may take on a myriad of different configurations. In this illustrative embodiment, the members 130b, 130c and 130d are configured as semicircular projections that are sized to match up with the correspondingly semicircular shaped notches 160b, 160c, 160d of the substrate 60 and the semicircular shaped notches 180a, 180b and 180c of the substrate 90. The members 150b, 150c and 150d are similarly configured as semicircular projections that are sized to match up with the correspondingly semicircular shaped notches 170b, 170c and 170d of the package substrate 60 and the semicircular notches 190a, 190b and 190c of the package substrate 90. Indeed, the projections 130b and 130c may be separated by a distance $X_1$, the projections 130b and 130d by a distance $X_2$ and the projections 130c and 130d by a distance $X_2-X_1$. The notches 160b, 160c and 160d, and the notches 180a, 180b and 180c are advantageously formed with the same spacings $X_1$, $X_2$ and $X_2-X_1$. The projections 150b, 150c and 150d may be provided with similar spacings to match the spacings of the notches 170b, 170c and 170d of the package 60 and 190a, 190b and 190c of the package 90. However, the skilled artisan will appreciate that the separation distances between the projections 150b, 150c and 150d need not match the separations of the projections 130b, 130c and 130d so long as the spacings of the projections 150b, 150c and 150d match the spacing of the notches 170b, 170c and 170d of the substrate 60 and the notches 190a, 190b and 190c of the substrate 90.

The members 130a and 130e may be configured as partially rounded or other shaped structures with respective flat surfaces 250a and 250e. The projections 150a and 150e may be similarly configured as semi-rounded structures with opposing flat surfaces 260a and 260e. The flat surfaces 250a and 260a are designed to engage an edge 270 of the package substrate 90 and the surfaces 250e and 260e are designed to engage the opposite edge 280 of the package substrate 90 if and when the package substrate 90 is seated in the socket 20.

To accommodate the larger package substrate 60, the edges 250a and 260a of the members 130a and 150a are designed to engage corresponding edges 300a and 310a of the notches 160a and 170a of the package 60 and the edges 250e and 260e of the members 130e and 170e are designed to engage opposingly faced edges 320e and 330e of the notches 160e and 170e. It should be understood that any or all of the members 130a, 130b, 130c, 130d, 130e, 150a, 150b, 150c, 150d and 150e could be made separate and non-integral with the peripheral wall 120. Such a detached member 332 is shown as a dashed structure on the socket in FIG. 3

A great variety of different arrangements of projections and notches may be used to accommodate multiple sizes of package substrates in the same socket. One advantage of making the arrangement slightly asymmetric by, for example, grouping the four members 130b 130c and 150b and 150c together, and only the two projections 130d and 150d together is that such an arrangement provides a ready way of identifying the proper orientation of the package substrate 60 relative to the socket 20 so that the installer can quickly and accurately position the substrate 60 or the substrate 90 relative to the socket 20 during installation. Another function served by the various projections 130a, 130b, 130c, 130d, 130e, 150a, 150b, 150c, 150d and 150e is to provide a ready alignment mechanism to facilitate the vertical movement of the substrate 60 or 90 as the case may be down into the socket 20. Thus, the members 130a, 130b, 130c, 130d, 130e, 150a, 150b, 150c, 150d and 150e enable the substrates 60 and 90 to be located in the socket 20 at respective preselected positions.

The socket 20 may be composed of a variety of electrically insulating materials, such as liquid crystal polymer, fiberglass resin materials, well-known plastics or the like. If composed of plastic materials, the socket 20 may be formed by injection molding, machining or other well-known material shaping techniques. The entire socket 20, including the peripheral wall 120 and the members 130a, 130b, 130c, 130d, 130e, 150a, 150b, 150c, 150d and 150e may be integrally formed as a unit. Optionally, the various members and the peripheral wall 120 may be separately formed and secured together.

Figure 4:
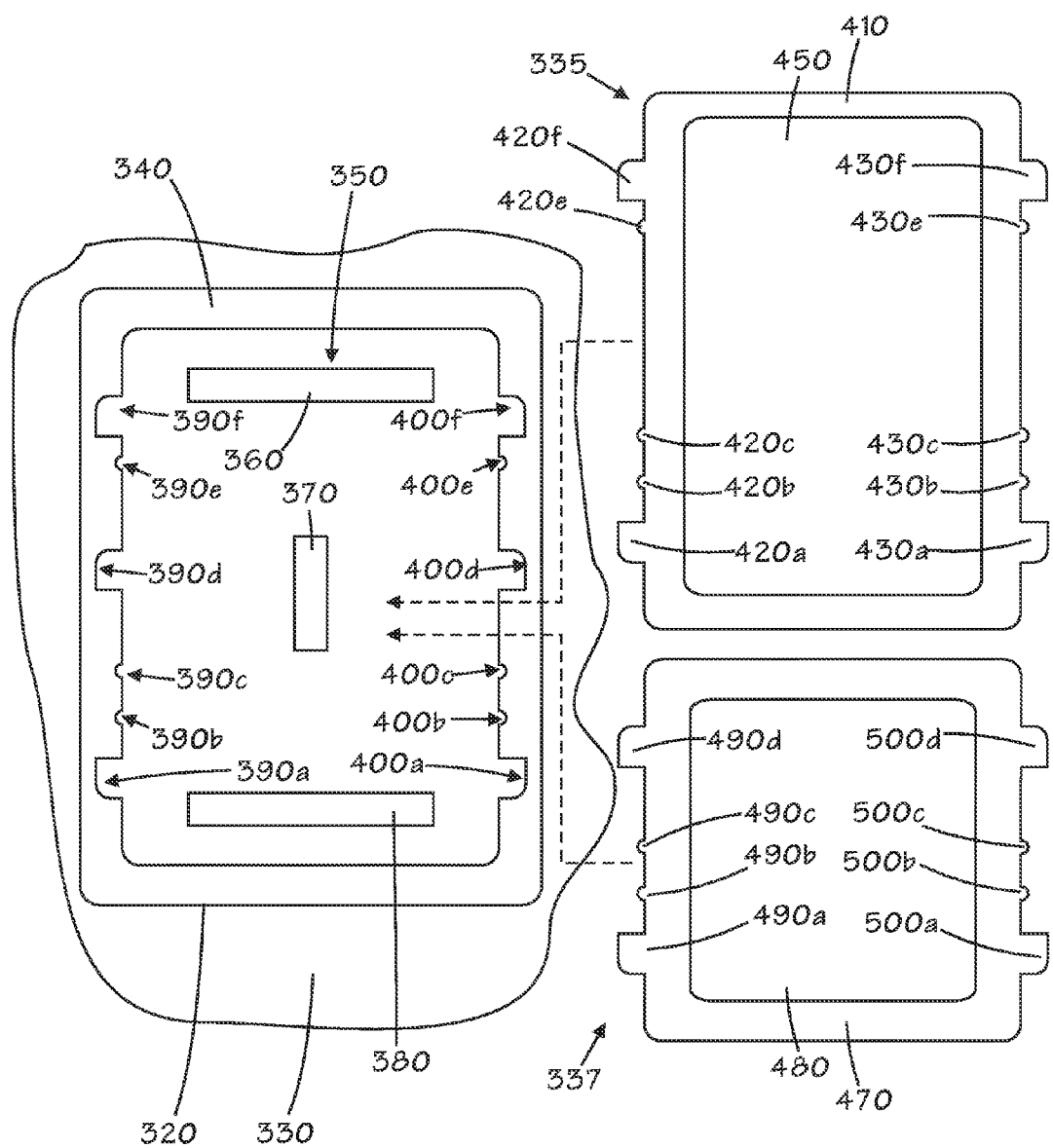
FIG. 4 is an overhead view of an alternate exemplary embodiment of a socket and printed circuit board.

In the foregoing disclosed exemplary embodiment, the socket 20 is provided with a plurality of members or projections 130a, 130b, 130c, 130d, 130e, 150a, 150b, 150c, 150d and 150e, the package 40 with notches 160a, 160b, 160c, 160d, 160e, 170a, 170b, 170c, 170d, 170e and the package 50 with notches 180a, 180b, 180c, 190a, 190b and 190c. However, the skilled artisan will appreciate that the same alignment functionality for a socket to accommodate multiple sizes of package substrates may be obtained by providing the socket with a plurality of structural features or notches and the packages with a corresponding plurality of outwardly structural features or members. An example of this alternative embodiment is shown in FIG. 4, which is an overhead view depicting an exemplary socket 320 positioned on a printed circuit board 330. Only a portion of the printed circuit board 330 is shown for simplicity of illustration. Two exemplary chip packages 335 and 337 are shown adjacent to the socket 320. The socket 320 includes a peripheral wall 340 that circumscribes an interior space 350. The socket 320 may be provided with plural openings 360, 370 and 380 that may be configured like the openings 200, 210 and 220 depicted in FIGS. 1 and 3. The peripheral wall 340 of the socket 320 may be provided with a plurality of notches 390a, 390b, 390c, 390d 390e and 390f and an oppositely positioned plurality of notches 400a, 400b, 400c, 400d, 400e and 400f. A package substrate 410 of the package 335 may be provided with corresponding pluralities of projections or members 420a, 420b, 420c, 420e and 420f that are designed to engage the notches 390a, 390b, 390c, 390e and 390f and another plurality of projections 430a, 430b, 430c, 430e and 430f that are designed to engage the notches 400a, 400b, 400c, 400e and 400f of the socket 320. An optional lid 450 is also shown on the package substrate 410. The semiconductor chip package 337 includes a package substrate 470 and an optional lid 480 may also be inserted into the socket 320. In this regard, the package substrate 470 may be provided with a plurality of projections 490a, 490b, 490c and 490d that are sized and spaced to engage the notches 390a, 390b, 390c and 390d and an oppositely positioned set of projections 500a, 500b, 500c and 500d that are sized and spaced to engage the notches 400a, 400b, 400c and 400d of the socket 320. As with the other disclosed embodiment, the size, number and arrangement of the notches 390a, 390b, 390c, 390d, 390e, 390f, 400a, 400b, 400c, 400d, 400e and 400f of the socket 320, and the various members 420a, 420b, 420c, 420, 420e, 420f, 430a, 430b, 430c, 430e and 430f of the package 335 and the members 490a, 490b, 490c, 490d, 500a, 500b, 500c and 500d of the package 337 are subject to great variation.

Any of the semiconductor chip packages disclosed herein, may be somewhat rigidly secured to the sockets disclosed herein in a variety of ways. An exemplary embodiment of a mechanism to hold a semiconductor chip package into the multi-sized socket embodiment 20 may be understood by referring now to FIG. 5, which is a pictorial view of the socket 20 positioned on the printed circuit board 30. Again, only a portion of the printed circuit board 30 is shown for simplicity of illustration. The socket 20 is provided with a pivotable frame 520 that is pivotally coupled to the socket 20 or to the printed circuit board 30 by way of a pivot pin 530. The frame 520 is operable to pivot around the pivot pin 530 and swing through the arc 540 to pivot from the open position shown in FIG. 4 to a closed position in which the frame 520 is seated on the peripheral wall 120 of the socket 20 and on some portions of a chip package, such as either of the packages 40 or 50 shown in FIGS. 1 and 3. A lever 550 is pivotally mounted to either the socket 120 or the printed circuit board 30 by way of a pair of blocks 560 and 570 and operable to swing through an arc 575. The lever 550 has a member 580 that is designed to engage a lip 590 of the stiffener frame 520 when the frame 520 is seated on the socket 20 and the lever 550 is pivoted downward towards the printed circuit board 30 and held into position by a clip 600.

Figure 5:
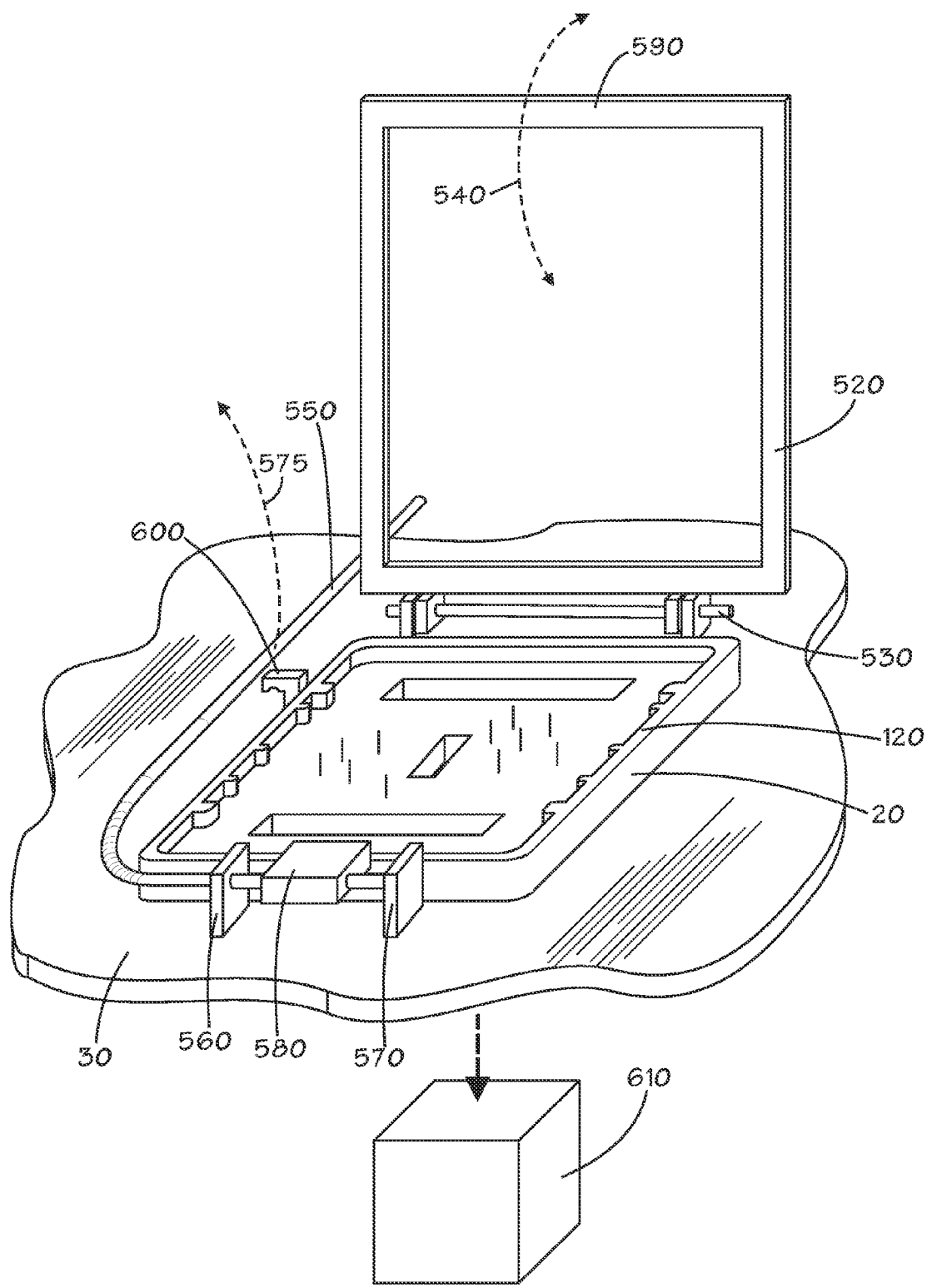
FIG. 5 is a pictorial view of an exemplary socket with a clamping mechanism, a printed circuit board and a computing system.

Any of the disclosed socket embodiments may be placed in a computing system. An exemplary computing system 610 is shown in FIG. 5 and may consist of a personal computer, a server, a mobile computing device, or some other computing system.

Figure 6:
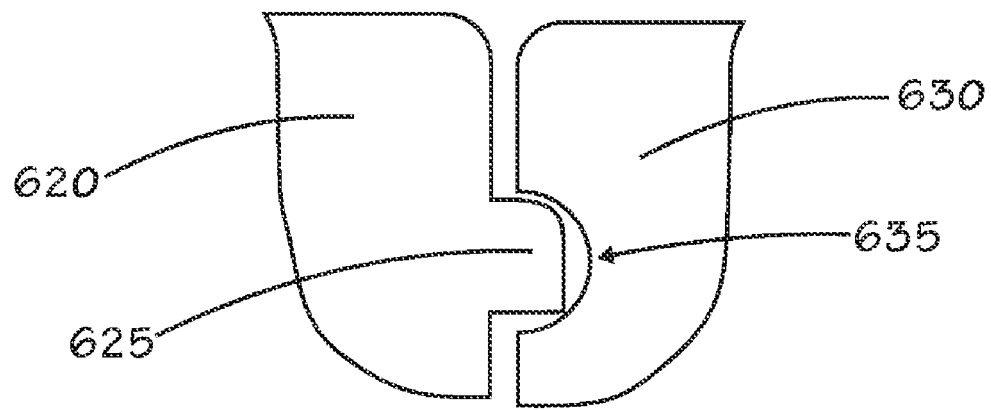
FIG. 6 is an overhead view of a portion of engaged pieces.

The skilled artisan will appreciate that the cooperating notches and members on a substrate and/or a socket can take on a variety of shapes. Attention is now turn to FIG. 6, which is an overhead view of a small portion of a piece 620 that has a member 625 and a piece 630 that has a semicircular notch 635. The member 625 of the piece 620 is engaged in the notch 635 of the piece 630. The piece 620 may be a package substrate or a socket and the piece 630 may be the opposite, that is, a socket or a package substrate. A semicircular notch configuration may be easily fabricated using a boring tool capable of drilling a circular hole in, for example, a sheet of multiple package substrates. After the hole is drilled, the sheet may be cleaved along the midpoint of the hole to yield the notch 635.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a socket with a peripheral wall defining an interior space; and
   forming a first plurality of structural features on the peripheral wall;
   forming a second plurality of structural features on the peripheral wall; and coupling a printed circuit board to the socket; wherein
   the first plurality of structural features are configured to engage corresponding structural features of a first semiconductor chip package in a first preselected portion in the interior space;
   the second plurality of structural features are configured to engage corresponding structural features of a second semiconductor chip package in a second preselected portion in the interior space; and
   the first semiconductor chip package is different in size from the second semiconductor chip package.

2. The method of claim 1, comprising placing the socket in a computing system.

3. The method of claim 1, wherein the pluralities of structural features of the first and second semiconductor chip packages comprise first and second pluralities of notches, and the structural features formed on the peripheral wall comprise a plurality of members projecting into the interior space.

4. The method of claim of claim 1, wherein the structural features on the peripheral wall are formed integral with the peripheral wall.

5. The method of claim 1, comprising forming an interconnect system to electrically interface the socket with either of the first and second semiconductor chip package substrates.

6. The method of claim 5, wherein the forming an interconnect system comprises forming a land grid array.

7. A method of manufacturing, comprising:
   providing a socket with a peripheral wall defining an interior space adapted to receive either of a first semiconductor chip package substrate and a second semiconductor chip package substrate, the first semiconductor chip package substrate having a first size and a first plurality of structural features, the second semiconductor chip package substrate having a second size different than the first size and a second plurality of structural features, the socket having a third plurality of structural features for the socket operable to engage either of the first plurality of structural features of the first semiconductor chip package substrate and the second plurality of features of the second semiconductor chip package substrate, to selectively enable the first semiconductor chip package substrate to be located at a first preselected position in the interior space and the second semiconductor chip package substrate to be located at a second preselected position in the interior space;
   coupling the socket to a printed circuit board; and
   mounting one or the other of the first and second semiconductor chip package substrate in the socket.

8. The method of claim 7, comprising placing the socket in a computing system.

9. The method of claim 7, wherein the first and second pluralities of structural features comprise first and second pluralities of notches, the providing the socket with the third plurality of structural features comprises providing a socket having a plurality of members projecting into the interior space.

10. The method of claim 7, wherein the first plurality of structural features comprises a plurality of members projecting away from the first semiconductor chip package substrate, the second plurality of structural features comprises a plurality of members projecting away from the second semiconductor chip package substrate, and the providing the socket having the third plurality of structural features comprises providing a socket having a plurality of notches in the peripheral wall.

11. The method of claim 7, comprising forming an interconnect system to electrically interface the socket with either of the first and second semiconductor chip package substrates.

12. The method of claim 11, wherein the forming an interconnect system comprises forming a land grid array.

13. An apparatus, comprising:
   a socket including a peripheral wall defining an interior space, the peripheral wall comprising a first plurality of structural features and a second plurality of structural features formed thereon; and a printed circuit board coupled to the socket; wherein
   the first plurality of structural features are configured to engage a plurality of corresponding structural features of a first semiconductor chip package in a first preselected portion in the interior space;
   the second plurality of structural features are configured to engage a plurality of corresponding structural features of a second semiconductor chip package in a second preselected portion in the interior space; and
   the first semiconductor chip package is different in size from the second semiconductor chip package.

14. The apparatus of claim 13, wherein the socket comprises a part of a computing system.

15. The apparatus of claim 13, wherein the pluralities of structural features of the first and second semiconductor chip packages comprise first and second pluralities of notches and the structural features formed on the peripheral wall comprise a plurality of members projecting into the interior space.

16. The apparatus of claim 13, wherein the structural features on the peripheral wall are formed on the peripheral wall.

17. The apparatus of claim 13, comprising a mechanism to hold either of the first and second semiconductor chip package substrate in the socket.

18. The apparatus of claim 13, wherein the socket includes an interconnect system to electrically interface with either of the first and second semiconductor chip package substrates.

19. The apparatus of claim 18, wherein the interconnect system comprises a land grid array.

20. An apparatus, comprising:
   a socket including a peripheral wall defining an interior space, the peripheral wall comprising a first plurality of structural features and a second plurality of structural features formed thereon; wherein
   the first plurality of structural features are configured to engage a plurality of corresponding structural features of a first semiconductor chip package in a first preselected portion in the interior space;
   the second plurality of structural features are configured to engage a plurality of corresponding structural features of a second semiconductor chip package in a second preselected portion in the interior space;
   the first semiconductor chip package is different in size from the second semiconductor chip package; and
   the socket is configured to seat only the first semiconductor chip package or the second semiconductor chip package.

* * * * *